United States Patent [19]

Thomas

[11] 4,193,820
[45] Mar. 18, 1980

[54] INTERCONNECTION DEVICE FOR SOLAR CELLS

[75] Inventor: Ronald Thomas, Wassenaar, Netherlands

[73] Assignee: Organisation Europeenne de Recherches Spatiales, Paris, France

[21] Appl. No.: 994,737

[22] Filed: Sep. 22, 1978

[30] Foreign Application Priority Data

Oct. 7, 1977 [BE] Belgium .................... 181550

[51] Int. Cl.² ........................................ H01L 31/00
[52] U.S. Cl. ............................ 136/89 P; 16/128 R; 16/DIG. 13
[58] Field of Search ............ 16/128 R, 150, DIG. 13; 136/89 P, 89 SA

[56] References Cited

U.S. PATENT DOCUMENTS

| | | | |
|---|---|---|---|
| 3,005,862 | 10/1961 | Escoffery | 136/89 P |
| 3,375,141 | 3/1968 | Julius | 136/89 P |
| 3,445,052 | 5/1969 | Lewallen | 16/DIG. 13 |
| 3,819,417 | 6/1974 | Haynos | 136/89 P |
| 3,849,880 | 11/1974 | Haynos | 136/89 P |

FOREIGN PATENT DOCUMENTS

| | | | |
|---|---|---|---|
| 1584029 | 4/1970 | Fed. Rep. of Germany | 16/DIG. 13 |
| 2411690 | 3/1973 | Fed. Rep. of Germany | 136/89 P |

*Primary Examiner*—Wayne L. Shedd
*Attorney, Agent, or Firm*—Stevens, Davis, Miller & Mosher

[57] ABSTRACT

An interconnection device for solar cells is described comprising two flat strips intended to be welded to two adjacent solar cells and a hinge element linking the two flat strips, said hinge element having two branches each connected by its free end to one of the flat strips and the said hinge element extending longitudinally between the two adjacent solar cells. The hinge element may be covered with an insulating material. In a particular embodiment the branches of the hinge element are linked by a linking element.

3 Claims, 4 Drawing Figures

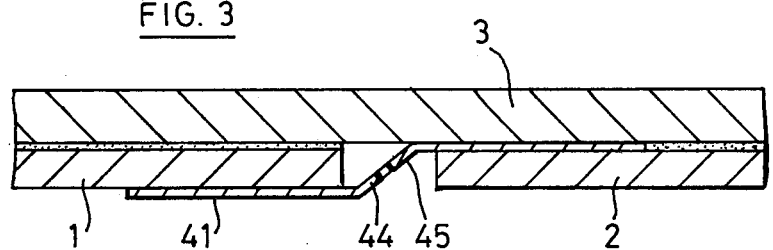
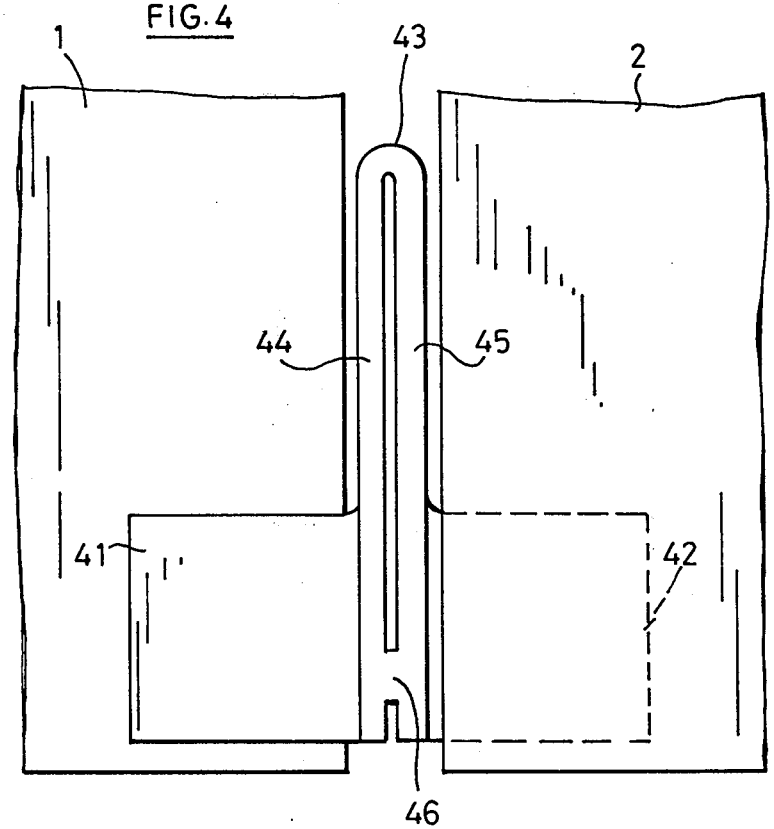

INTERCONNECTION DEVICE FOR SOLAR CELLS

BACKGROUND OF THE INVENTION

The present invention relates to an interconnection device intended to make the electrical connections between solar cells used on board space vehicles.

A typical interconnection device as illustrated in FIG. 1 consists of a Z-shaped metal strip A whose two wings are intended to be welded to adjacent solar cells 1 and 2. These solar cells are mounted on a support 3 which is usually of aluminium, whilst the cells are usually constituted of silicon.

When the space vehicle is in orbit, the panels formed by the assemblies of solar cells undergo considerable stresses owing to wide periodic temperature variations (these variations can normally range from $-80°$ C. to $+80°$ C. approximately) and owing to mechanical vibrations. Since the coefficients of linear expansion are different for aluminium and silicon, that is, for the materials constituting the solar cells and their support, considerable strains arise in the interconnection devices. The known Z-shaped devices cannot withstand severe strains in a transverse direction to the parallel adjacent edges of contiguous solar cells, so that these interconnection devices tend to split and rupture.

The problem solved by the invention was how to improve the resistance of the interconnection devices to these transverse strains and the object of the invention is an improved interconnection device which is capable of giving in all directions and which consequently considerably reduces the fatigue of the interconnection devices in space orbit.

SUMMARY OF THE INVENTION

The interconnection device according to the invention comprises two flat strips intended to be welded to two adjacent solar cells and a hinge element linking the two flat strips, said hinge element having two branches each connected by its free end to one of the flat strips and said hinge element extending longitudinally between the two adjacent solar cells.

DESCRIPTION OF THE DRAWINGS

An embodiment of this interconnection device is illustrated in the attached drawings wherein:

FIG. 3 is a cross-sectional view along the line III—III of FIG. 2;

FIG. 4 shows an alternative version of the embodiment of FIG. 2.

DESCRIPTION OF AN EMBODIMENT

Figure 1:
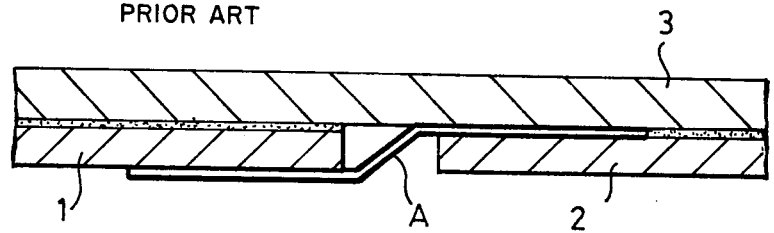
FIG. 1 is a cross section of a typical known interconnection device.
Figure 2:
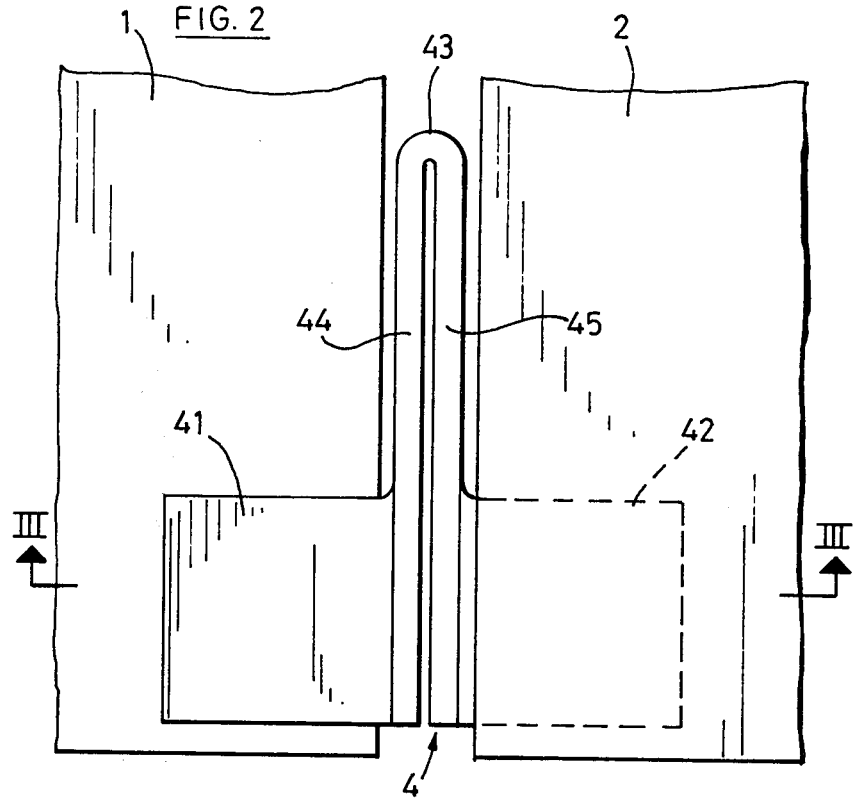
FIG. 2 is a plan view of an interconnection device according to the invention.

By reference to FIGS. 2 and 3, parts of two solar cells 1 and 2 fixed to a support 3 can be seen. The interconnection device 4 comprises two flat strips 41 and 42 intended to be welded to the solar cells 1 and 2 respectively and a hinge element 43 linking the flat strips 41 and 42 and extending longitudinally between the solar cells. This hinge element 43 has two branches 44 and 45 each having its free end connected to one of the flat strips 41 and 42 respectively. The length of the branches 44 and 45 is advantageously of the order of 2.5 to 4 mm.

This interconnection device can be manufactured from conventional materials either by stamping from sheets or strips with the slit of the hinge element 43 made with a diamond saw or by photo-engraving.

To prevent any short-circuit of a solar cell as a result of extreme relative displacement, if any, of the hinge element, the latter can be covered with a layer of suitable insulating material or else the side of the solar cells can be covered with a sheet of suitable insulating material, for example kapton 5.

FIG. 4 shows an alternative version of the embodiment of FIG. 2 for the purpose of improving the rigidity of the interconnection device during assembly of the solar cells. As shown by FIG. 4, the interconnection device is formed with a linking element 46 between the ends of the branches 44 and 45 of the hinge element. When the vehicle is in space orbit, the linking element 46 yields during the first strains and the interconnection device behaves subsequently, in the manner described above, according to the invention.

What is claimed is:

1. In a solar panel comprising a plurality of spaced apart planar solar cells arranged on at least one face of a supporting plate, an interconnection device for interconnecting adjacent solar cells each having an upper and a lower surface, said interconnection device comprising:

a pair of flat strips of electro-conducting material, a first of said flat strips attached to the upper surface of a first solar cell and the second of said flat strips attached to the lower surface of a second solar cell; and a hinge element of electro-conducting material having a U-shape and extending lengthwise in the gap between the pair of solar cells in a slant plane relative to the plane of the pair of solar cells, the end portions of said hinge element being connected each to a respective one of said flat strips.

2. The solar panel according to claim 1 wherein the hinge element has its faces covered with an insulating material.

3. The solar panel of claim 1 wherein a linking element is located between the parallel portions of the U-shaped hinge element.

* * * * *